United States Patent
Huang et al.

(10) Patent No.: US 11,430,351 B2
(45) Date of Patent: Aug. 30, 2022

(54) PROCESSING METHOD AND PROCESSING SYSTEM OF A FLEXIBLE SUBSTRATE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Weiyun Huang, Beijing (CN); Tianyi Cheng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 871 days.

(21) Appl. No.: 16/301,985

(22) PCT Filed: Jun. 27, 2018

(86) PCT No.: PCT/CN2018/093094
§ 371 (c)(1),
(2) Date: Nov. 15, 2018

(87) PCT Pub. No.: WO2019/024626
PCT Pub. Date: Feb. 7, 2019

(65) Prior Publication Data
US 2021/0225208 A1 Jul. 22, 2021

(30) Foreign Application Priority Data
Aug. 4, 2017 (CN) .......................... 201710660238.0

(51) Int. Cl.
G09F 9/30 (2006.01)
H05K 1/18 (2006.01)
H05K 3/00 (2006.01)
H05K 3/36 (2006.01)
H05K 3/38 (2006.01)

(52) U.S. Cl.
CPC ............. *G09F 9/301* (2013.01); *H05K 1/189* (2013.01); *H05K 3/0058* (2013.01);
(Continued)

(58) Field of Classification Search
CPC ...... G09F 9/301; H05K 1/189; H05K 3/0058; H05K 3/0085; H05K 3/361; H05K 3/386
(Continued)

(56) References Cited

U.S. PATENT DOCUMENTS

| 8,703,368 B2 | 4/2014 | Lee et al. |
| 2009/0188620 A1* | 7/2009 | Okuda ................. C04B 37/008 156/277 |

(Continued)

FOREIGN PATENT DOCUMENTS

| CN | 1326824 A | 12/2001 |
| CN | 1645255 A | 7/2005 |

(Continued)

OTHER PUBLICATIONS

The First Chinese Office Action dated Sep. 29, 2019; Appln. No. 201710660238.0.
(Continued)

*Primary Examiner* — Peter Dungba Vo
*Assistant Examiner* — Azm A Parvez

(57) ABSTRACT

A flexible substrate, a method of processing a flexible substrate and a system of processing a flexible substrate. The method of processing the flexible substrate includes: measuring a first expansion volume of the flexible substrate; and applying a first application pressure to the flexible substrate to laminate the flexible substrate on a base substrate; according to a first corresponding relationship between a first pressure applied to the flexible substrate and a compressive expansion volume generated by the flexible substrate in compression and according to the first expansion volume,
(Continued)

the first application pressure is selected to allow a second expansion volume of the flexible substrate to at least partially compensate for the first expansion volume.

16 Claims, 8 Drawing Sheets

(52) U.S. Cl.
CPC ........... *H05K 3/0085* (2013.01); *H05K 3/361* (2013.01); *H05K 3/386* (2013.01); *H05K 2201/0154* (2013.01); *H05K 2201/09418* (2013.01); *H05K 2201/10128* (2013.01)

(58) Field of Classification Search
USPC .................. 29/846, 832, 829, 825, 592.1
See application file for complete search history.

(56) References Cited

U.S. PATENT DOCUMENTS

| | | |
|---|---|---|
| 2014/0071639 A1 | 3/2014 | Honjo et al. |
| 2017/0066024 A1 | 3/2017 | Fischer et al. |

FOREIGN PATENT DOCUMENTS

| | | | | |
|---|---|---|---|---|
| CN | 103543611 A | | 1/2014 | |
| CN | 104979316 A | | 10/2015 | |
| CN | 105307416 A | | 2/2016 | |
| CN | 105513500 A | | 4/2016 | |
| CN | 106257314 A | | 12/2016 | |
| CN | 106852197 A | | 6/2017 | |
| CN | 106935596 A | * | 7/2017 | ......... H01L 21/7813 |
| CN | 106935596 A | | 7/2017 | |
| JP | 2008234920 A | * | 10/2008 | |
| KR | 1020080029835 A | | 4/2008 | |
| TW | 200631782 A | | 9/2006 | |
| WO | 2014/139851 A1 | | 9/2014 | |

OTHER PUBLICATIONS

The First Indian Office Action dated Feb. 23, 2021; Appln. No. 201847046388.

* cited by examiner

PROCESSING METHOD AND PROCESSING SYSTEM OF A FLEXIBLE SUBSTRATE

CROSS-REFERENCE TO RELATED APPLICATIONS

The application claims priority to the Chinese patent application No. 201710660238.0, filed on Aug. 4, 2017, the entire disclosure of which is incorporated herein by reference as part of the present application.

TECHNICAL FIELD

Embodiments of the present disclosure relate to a flexible substrate, a method of processing a flexible substrate and a system of processing a flexible substrate.

BACKGROUND

A flexible display device is such a display device which is made of a soft material and is deformable and bendable. Flexible display devices have the advantages of low power consumption, small size, portability and so on, and will become a next-generation display technology. Flexible display devices can be applied to many electronic products, such as mobile phones, tablet computers, televisions, laptops, etc.

SUMMARY

At least one embodiment of the present disclosure provides a method of processing a flexible substrate, including: measuring a first expansion volume of the flexible substrate; and applying a first application pressure to the flexible substrate to laminate the flexible substrate on a base substrate, wherein according to a first corresponding relationship between a first pressure applied to the flexible substrate and a compressive expansion volume generated by the flexible substrate in compression and according to the first expansion volume, the first application pressure is selected to allow a second expansion volume of the flexible substrate to at least partially compensate for the first expansion volume.

For example, the method of processing the flexible substrate provided by at least one embodiment of the present disclosure further includes: lifting off the flexible substrate from a rigid substrate, wherein the first expansion volume is a contraction volume generated when the flexible substrate is lifted off from the rigid substrate.

For example, in the method of processing the flexible substrate provided by at least one embodiment of the present disclosure, a laser lift-off process is conducted to lift off the flexible substrate from the rigid substrate.

For example, in the method of processing the flexible substrate provided by at least one embodiment of the present disclosure, the first application pressure is a pressure applied to the flexible substrate during a back film attachment process; and the second expansion volume is an expansion volume generated by the flexible substrate during the back film attachment process.

For example, the method of processing the flexible substrate provided by at least one embodiment of the present disclosure further includes: establishing the first corresponding relationship between the first pressure applied to the flexible substrate and the compressive expansion volume of the flexible substrate.

For example, in the method of processing the flexible substrate provided by at least one embodiment of the present disclosure, establishing the first corresponding relationship between the first pressure applied to the flexible substrate and the compressive expansion volume of the flexible substrate includes: obtaining a change curve of the second expansion volume of the flexible substrate with respect to the first pressure; or dividing the second expansion volume of the flexible substrate into a plurality of sections by size, wherein each of the sections corresponds to one value of the first pressure.

For example, the method of processing the flexible substrate provided by at least one embodiment of the present disclosure further includes: subsequent to the lamination process, bonding the flexible substrate to an integrated circuit board or a flexible printed circuit board.

For example, in the method of processing the flexible substrate provided by at least one embodiment of the present disclosure, bonding the flexible substrate to the integrated circuit board or the flexible printed circuit board includes: measuring the second expansion volume of the flexible substrate: and according to a second corresponding relationship between a temperature applied to the flexible substrate and a thermal expansion volume generated by the flexible substrate being heated during the bonding process, and according to the second expansion volume, selecting a temperature at which the flexible substrate is bonded to allow a third expansion volume of the flexible substrate to at least compensate for the second expansion volume.

For example, the method of processing the flexible substrate provided by at least one embodiment of the present disclosure further includes: according to the temperature applied to the flexible substrate during the bonding process, selecting a second pressure applied to the flexible substrate during the bonding process to allow the third expansion volume of the flexible substrate to at least compensate for the second expansion volume.

For example, the method of processing the flexible substrate provided by at least one embodiment of the present disclosure further includes: establishing the second corresponding relationship between the temperature applied to the flexible substrate and the third expansion volume of the flexible substrate.

For example, in the method of processing the flexible substrate provided by at least one embodiment of the present disclosure, bonding the flexible substrate to the integrated circuit board or the flexible printed circuit board includes: tilting the flexible substrate and an input/output pad of the integrated circuit board or the flexible printed circuit board at a certain angle from a predetermined direction, and moving the input/output pad in the predetermined direction to allow the flexible substrate and the input/output pad of the integrated circuit board or the flexible printed circuit board to be aligned and bonded.

For example, in the method of processing the flexible substrate provided by at least one embodiment of the present disclosure, the first expansion volume and/or the second expansion volume is measured by an automatic optic inspection device.

At least one embodiment of the present disclosure provides a flexible substrate that is obtained by the processing method according to any one of the above.

At least one embodiment of the present disclosure provides a system of processing a flexible substrate, including: a measurer, which is configured to measure a first expansion volume of the flexible substrate; and a controller, which is configured to apply a first application pressure to the flexible substrate to laminate the flexible substrate on a base substrate, wherein according to a first corresponding relationship between a first pressure applied to the flexible substrate and a compressive expansion volume generated by the flexible substrate in compression and according to the first expansion volume, the first application pressure is selected to allow a second expansion volume of the flexible substrate to at least partially compensate for the first expansion volume.

For example, the system of processing the flexible substrate provided by at least one embodiment of the present disclosure further includes: a stripper, which is configured to lift off the flexible substrate from a rigid substrate, wherein the first expansion volume is a contraction volume generated when the flexible substrate is lifted off from the rigid substrate.

For example, the system of processing the flexible substrate provided by at least one embodiment of the present disclosure further includes: a back film attaching device, which is configured to attach a back film to the flexible substrate; wherein the first pressure is a pressure applied to the flexible substrate during a back film attachment process; and the second expansion volume is an expansion volume generated by the flexible substrate during the back film attachment process.

For example, the system of processing the flexible substrate provided by at least one embodiment of the present disclosure further includes: a memory, which is configured to store the first corresponding relationship between the first pressure applied to the flexible substrate and the second expansion volume generated by the flexible substrate.

For example, the system of processing the flexible substrate provided by at least one embodiment of the present disclosure further includes: a bonder, which is configured to bond the flexible substrate to an integrated circuit board or a flexible printed circuit board.

For example, in the system of processing the flexible substrate provided by at least one embodiment of the present disclosure, the measurer is further configured to measure the second expansion volume of the flexible substrate: and the controller is further configured to, according to a second corresponding relationship between a temperature applied to the flexible substrate and a thermal expansion volume generated by the flexible substrate being heated during the bonding process as well as the first expansion volume and the second expansion volume, select a temperature at which the flexible substrate is bonded to allow a third expansion volume of the flexible substrate to at least compensate for the second expansion volume.

For example, in the system of processing the flexible substrate provided by at least one embodiment of the present disclosure, the controller is further configured to, according to the temperature applied to the flexible substrate during the bonding process, select a second pressure applied to the flexible substrate during the bonding process.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

Figure 1:
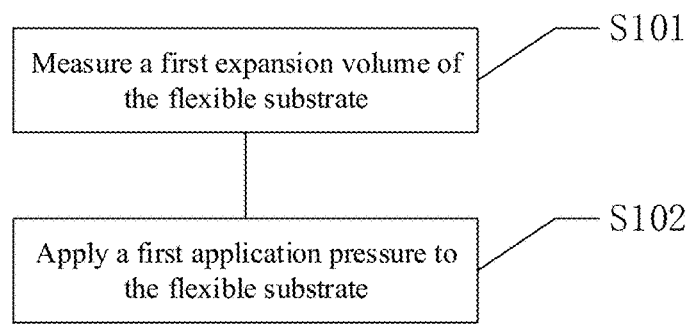
FIG. 1 is a flowchart of a method of processing a flexible substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventors of the present disclosure have found in research that the fabrication substrate, such as polyimide (PI), of a flexible display device tends to contract during the preparation processes, and during the process of bonding the flexible substrate to a chip on flexible printed circuit (COF) or an integrated circuit (IC), differences in expansion of different flexible substrates result ii problems such as difficulty in bonding the flexible substrate to the COF or IC. Although the existing bonding method can make a certain compensation for the expansion volume of the flexible substrate, the compensation range is limited, and is difficult to meet the requirements in the production processes.

At least one embodiment of the present disclosure provides a method of processing a flexible substrate, including: measuring a first expansion volume of the flexible substrate; and applying a first application pressure to the flexible substrate to laminate the flexible substrate on a base substrate. According to a first corresponding relationship between a first pressure applied to the flexible substrate and a compressive expansion volume generated by the flexible substrate in compression and according to the first expansion volume, the first application pressure is selected to allow a second expansion volume of the flexible substrate to at least partially compensate for the first expansion volume.

At least one embodiment of the present disclosure provides a flexible substrate that is obtained by the processing method of any one of the above.

At least one embodiment of the present disclosure provides a system of processing a flexible substrate, including: a measurer, which is configured to measure a first expansion volume of the flexible substrate; and a controller, which is configured to apply a first application pressure to the flexible substrate to laminate the flexible substrate on a base substrate. According to a first corresponding relationship between a first pressure applied to the flexible substrate and a compressive expansion volume generated by the flexible substrate in compression and according to the first expansion volume, the first application pressure is selected to allow a second expansion volume of the flexible substrate to at least partially compensate for the first expansion volume.

Hereinafter, a flexible substrate, a method of processing a flexible substrate and a system of processing a flexible substrate of the present disclosure will be described through several specific embodiments.

For example, the fabrication of a flexible substrate for a flexible display device is generally conducted on a rigid substrate as a support, on which functional layers, such as polyimide (PI), are provided (e.g., coated, deposited, etc.) to prepare driving array circuits, etc., and then the flexible substrate is lifted off from the rigid substrate. After the lift-off process, the flexible substrate is generally bonded to a chip on flexible printed circuit (COF) or an integrated circuit (IC) by means of anisotropic conductive adhesives by a hot-pressing method, so as to provide control signals or the like for the flexible substrate. The flexible substrate tends to produce a contraction volume during the lift-off process from the rigid substrate, so during the subsequent process of bonding the flexible substrate to the chip on flexible printed circuit (COF) or the integrated circuit (IC), due to the large expansion volume (relaxation volume or contraction volume) of the flexible substrate or large differences in the expansion volume of various flexible substrates in mass production, it is difficult to align and bond the flexible substrate to the COF or IC. Although the existing bonding method can make a certain compensation for the expansion volume of the flexible substrate, the compensation range is limited, and is difficult to meet the requirements in the production processes.

At least one embodiment of the present disclosure provides a method of processing a flexible substrate, and as illustrated in FIG. 1, the method includes steps S101 to S102.

Step S101: measuring a first expansion volume of the flexible substrate.

In the present embodiment, the first expansion volume may be an expansion volume generated by the flexible substrate in any process during the preparation. For example, the first expansion volume may be an expansion volume generated when the flexible substrate is lifted off from a rigid substrate during the preparation, and as the flexible substrate loses the support of the rigid substrate after being lifted off from the rigid substrate, the expansion volume generated by the flexible substrate during the lift-off process is generally a contraction volume.

Figure 2:
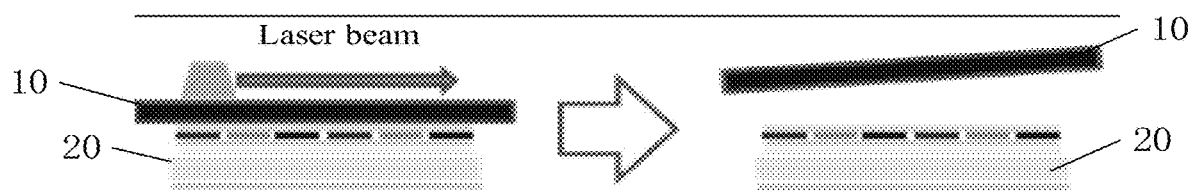
FIG. 2 is a schematic diagram of a lift-off process of the flexible substrate provided by an embodiment of the present disclosure.

For example, as illustrated in FIG. 2, the present embodiment may, for example, use a laser lift-off process to lift off the flexible substrate 20 from the rigid substrate 10; and the laser lift-off process may include decomposing the buffer layer between the flexible substrate 20 and the rigid substrate 10 by using laser energy to achieve the technical effect of separating the flexible substrate 20 from the rigid substrate 10. As illustrated in FIG. 2, portions to be lifted off of the flexible substrate 20 are sequentially irradiated with a laser beam so as to separate the flexible substrate 20 from the rigid substrate 10. Certainly, other lift-off processes can also be used in the present embodiment, which is not limited in the embodiments of the present disclosure.

In the present embodiment, the measurement of the expansion volume may be performed by, for example, an automatic optic inspection (AOI) device, and the dimensional change of the flexible substrate before and after the lift-off process is measured so that the value of the expansion volume of the flexible substrate is calculated. Other methods of measuring the expansion volume can also be used in the present embodiment, which is not limited in the embodiments of the present disclosure.

Step S102: applying a first application pressure to the flexible substrate to laminate the flexible substrate on a base substrate.

Figure 3:
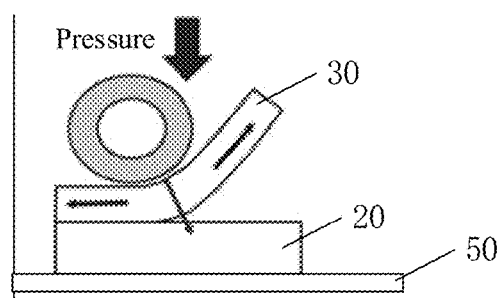
FIG. 3 is a schematic diagram of a back film attachment process of the flexible substrate provided by an embodiment of the present disclosure.

In the present embodiment, the first application pressure is applied to the flexible substrate 20 to laminate the flexible substrate 20 on the base substrate 50. FIG. 3 is a schematic diagram of an example of a back film attachment process of the flexible substrate 20. As illustrated in FIG. 3, the back film 30 is attached to the flexible substrate 20 by roller compacting, during this process, for example, the film is rolled around a roller (not shown) as well as the roller gradually releases the film 30 as the movement of the flexible substrate, and the back film 30 is adhered to the flexible substrate 20 by adhesive. In the present embodiment, the first application pressure may be a vertical downward pressure applied to the flexible substrate 20 by the roller during the back film 30 attachment process of the flexible substrate 20, and the pressure generates a compressive expansion volume of the flexible substrate 20, that is, a second expansion volume, which is usually a relaxation volume. Therefore, the relaxation volume generated by the flexible substrate 20 in compression during the back film attachment process can provide a certain compensation for the contraction volume of the flexible substrate 20 during the lift-off process.

In the present embodiment for example, according to a first corresponding relationship between the first pressure applied to the flexible substrate 20 and the compressive expansion volume generated by the flexible substrate 20 in compression: according to the first expansion volume, the first application pressure applied to the flexible substrate 20 is selected to allow the second expansion volume of the flexible substrate 20 to at least partially compensate for the first expansion volume, and therefore, the expansion volume of the flexible substrate 20 is reduced, or the differences in the expansion volume of different flexible substrates 20 in production are reduced. In the present embodiment, according to the first corresponding relationship, selecting a suitable first application pressure can effectively control the size of the second expansion volume, thereby controlling the second expansion volume to compensate for the size of the first expansion volume.

Figure 4:
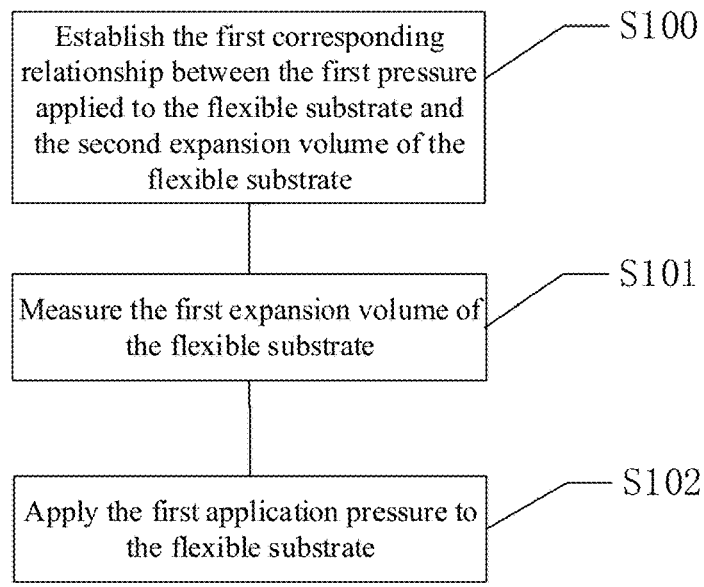
FIG. 4 is a flowchart of another method of processing the flexible substrate provided by an embodiment of the present disclosure.

In another example of the present embodiment, as illustrated in FIG. 4, the method of processing the flexible substrate may further include the following step S100 prior to the step S101.

Step S100: establishing the first corresponding relationship between the first pressure applied to the flexible substrate and the compressive expansion volume of the flexible substrate.

Figure 5A:
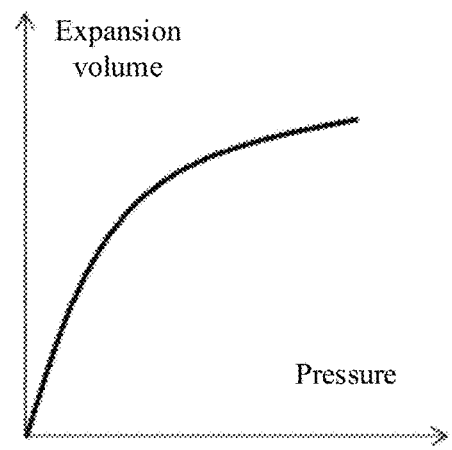
FIG. 5A to 5B are schematic diagrams of a relationship between a first pressure applied to the flexible substrate and a compressive expansion volume generated by the flexible substrate provided in an embodiment of the present disclosure.
Figure 5B:
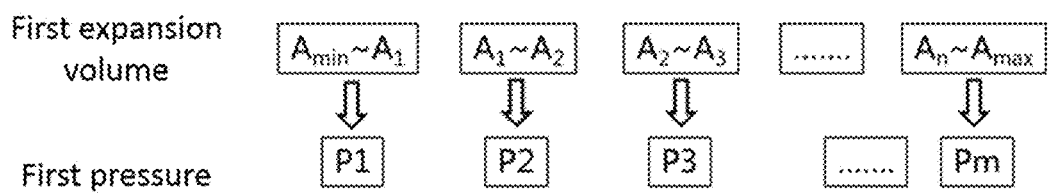

In the present example, the first corresponding relationship, for example, may be obtained before measuring the first expansion volume of the flexible substrate. The first corresponding relationship, for example, may be a change curve of the second expansion volume of the flexible substrate with respect to the first pressure. During obtaining the curve, the first pressure applied to the flexible substrate can be gradually changed, the expansion volume of the flexible substrate under the pressure is simultaneously measured, and finally the expansion volume-pressure curve as illustrated in FIG. 5A is obtained; or, the first corresponding relationship, for example, may further be obtained by dividing the second expansion volume of the flexible substrate into a plurality of sections by size, each of the sections corresponds to one value of the first pressure: and for example, as illustrated in FIG. 5B, the second expansion volume may be divided into a plurality of sections by size, such as $A_{min}$-$A_1$, $A_1$-$A_2$, $A_2$-$A_3$, . . . $A_n$-$A_{max}$, and each section of the expansion volume respectively corresponds to one pressure value, that is, $P_1$, $P_2$, $P_3$, . . . $P_m$; the pressure value corresponding to each section of the expansion volume, for example, may be a pressure value corresponding to one expansion volume within the section, or for example, may be a pressure value corresponding to the middle value or an average value of the expansion volumes in the expansion volume section.

In addition, the size and the number of the sections of the second expansion volume can be adjusted according to the production situation. For example, when the production amount is large, a large section size of the second expansion volume is applied; that is, a small section number of the second expansion volume is applied, so that the process of selecting the pressure for the expansion volume of each flexible substrate can be simplified, and the production time can be reduced; and for another example, when the production amount is small, a small section size of the second expansion volume is applied, that is, a large section number of the second expansion volume is applied, and even the expansion volume-pressure curve in which the second expansion volume and the first pressure have a one-to-one correspondence as illustrated in FIG. 5A is applied to select the pressure for the expansion volume of each flexible substrate, thus allowing the selection of the pressure value to be more accurate, thereby achieving the technical effect of effectively controlling the expansion volume of the flexible substrate.

Figure 6:
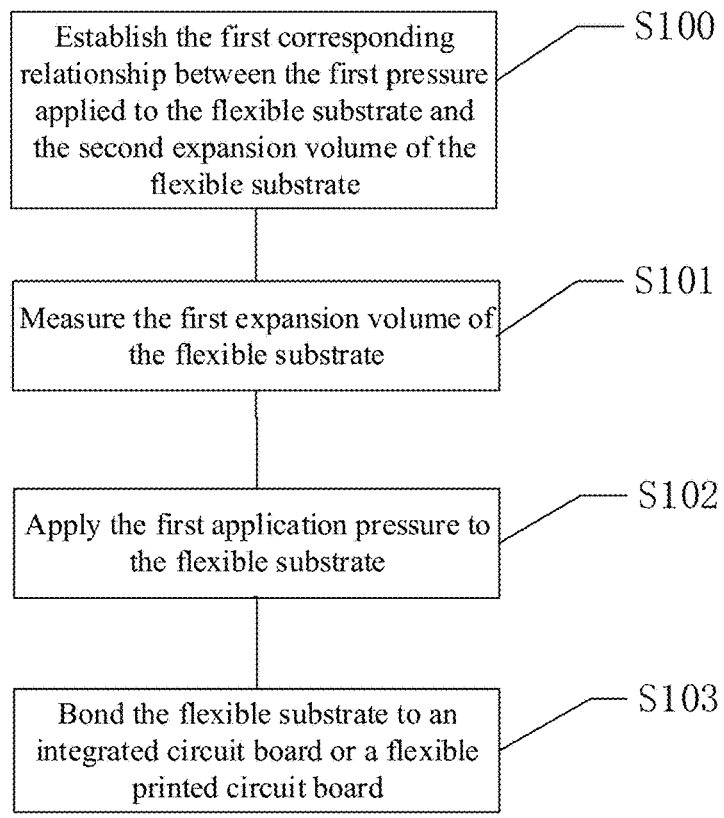
FIG. 6 is a flowchart of still another method of processing the flexible substrate provided by an embodiment of the present disclosure.

In another example of the present embodiment, as illustrated in FIG. 6, compared with the method as illustrated in FIG. 1 or FIG. 4, the method of processing the flexible substrate may further include the following step S103.

Step S103: bonding the flexible substrate to an integrated circuit board or a flexible printed circuit board.

In the present embodiment, for example, the following method can be used: tilting the flexible substrate and an input/output pad of the integrated circuit board or the flexible printed circuit board at a certain angle from a predetermined direction, and moving the input/output pad in the predetermined direction to allow the flexible substrate and the input/output pad of the integrated circuit board or the flexible printed circuit board to be aligned and bonded with each other, thereby bonding the flexible substrate to the integrated circuit board or the flexible printed circuit board.

Figure 7A:
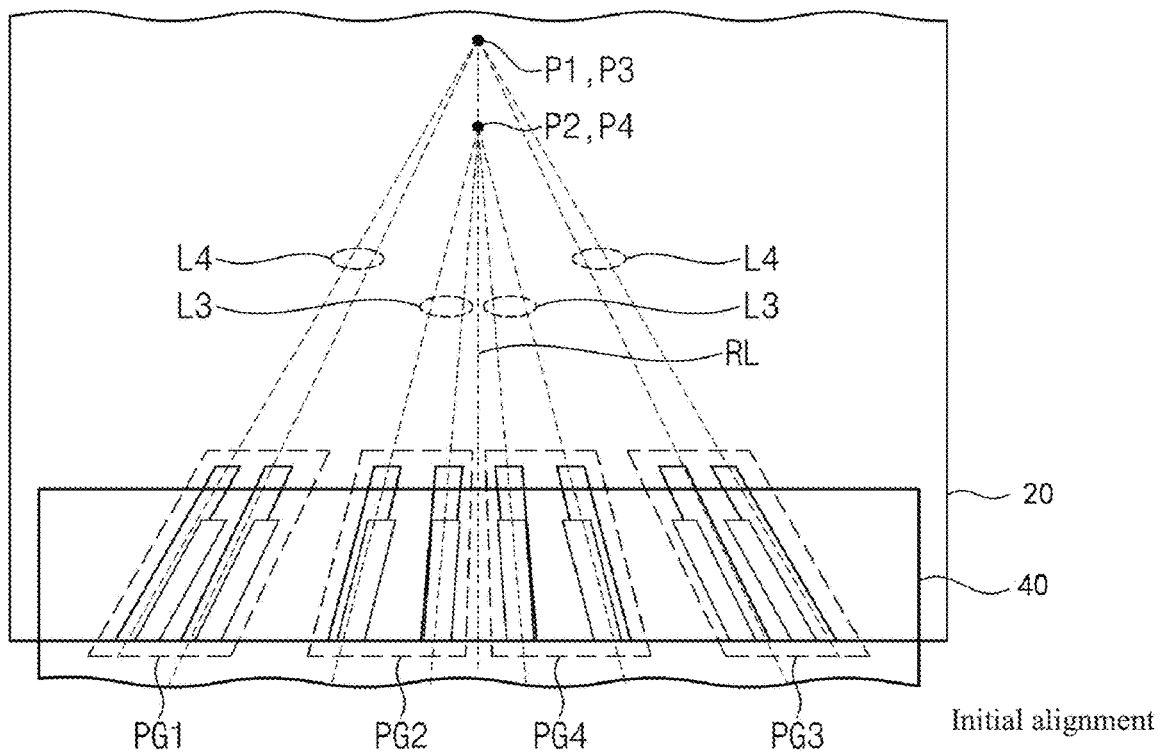
FIG. 7A to 7B are schematic diagrams of a bonding process of the flexible substrate provided by an embodiment of the present disclosure.
Figure 7B:
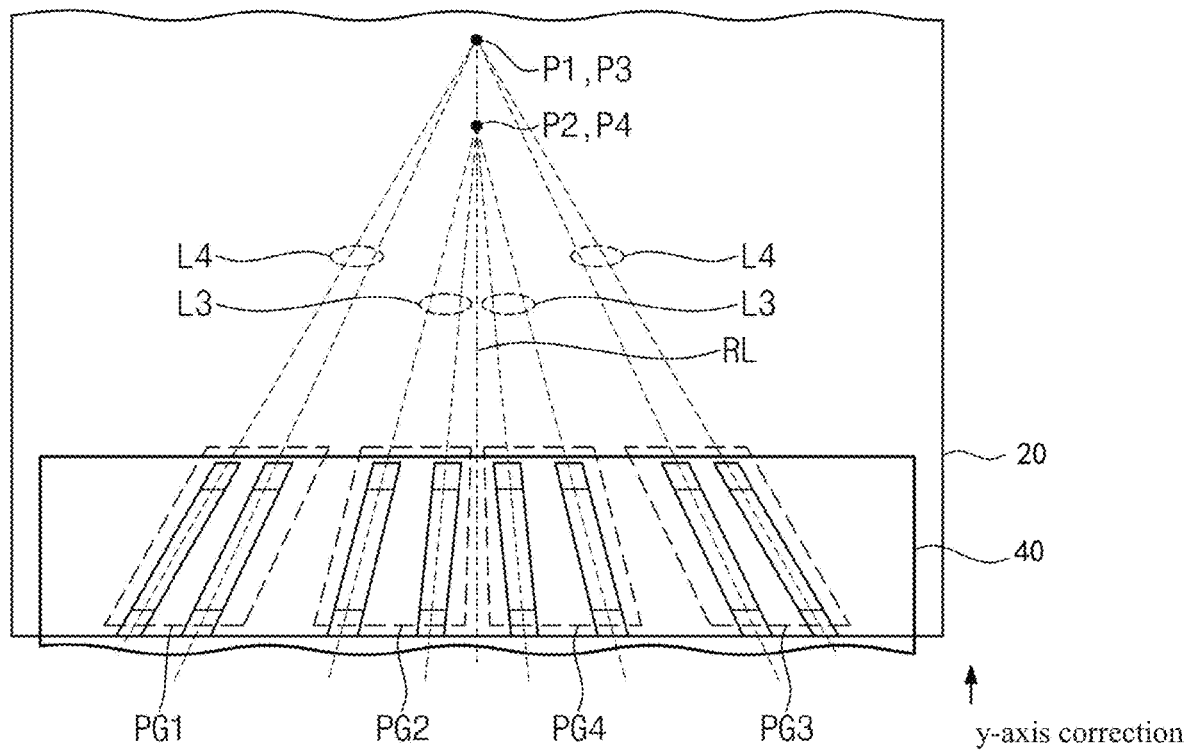

FIG. 7A to 7B are schematic diagrams of a bonding process of the flexible substrate provided by the present embodiment. In the present embodiment, as illustrated in FIGS. 7A and 7B, the flexible substrate 20 and the input/output pad sets (PG1, PG2, PG3, PG4, in which each input/output pad set includes two input/output pads) of the integrated circuit board or the flexible printed circuit board 40 are tilted at a certain angle from the predetermined direction RL, for example, the straight lines L3 on which PG2 and PG4 are located are at first angles with respect to the predetermined direction RL and converge at a first point (P2, P4), and the straight lines L4 on which PG1 and PG3 are located are at second angles and converge at a second point (P1, P3).

First, the flexible substrate 20 and the input/output pad sets of the integrated circuit board or the flexible printed circuit board 40 are initially aligned as illustrated in FIG. 7A to allow the flexible substrate 20 and the input/output pads of the integrated circuit board or the flexible printed circuit board 40 to have a one-to-one correspondence, and then the y-axis is corrected as illustrated in FIG. 7B, that is, the input/output pad sets (PG1, PG2, PG3, PG4) is moved in the predetermined direction RL to allow the flexible substrate 20 and the input/output pads of the integrated circuit board or the flexible printed circuit board 40 to be aligned and bonded one by one.

It should be noted that the number of the flexible substrate 20 and the input/output pad sets of the integrated circuit board or the flexible printed circuit board 40 may be increased, the input/output pads of each input/output pad set may also be adjusted according to the production situation, and the above embodiments are merely described for example.

In the present embodiment, because the second expansion volume of the flexible substrate compensates for the first expansion volume of the flexible substrate, the expansion volume of the flexible substrate is reduced to a small range, or the second expansion volume and the first expansion volume offset each other to allow the total expansion volume to be 0 or substantially 0, thereby reducing the total expansion volume of the flexible substrate and allowing the flexible substrate 20 and the input/output pads of the integrated circuit board or the flexible printed circuit board 40 to be easily aligned. In addition, in mass production, because the second expansion volume of the flexible substrate compensates for the first expansion volume of the flexible substrate, the differences in the expansion volume of different flexible substrates are reduced, and the expansion volume of each flexible substrate is controlled within a certain preset range, which is therefore more favorable to the subsequent bonding process, and the flexible substrate is bonded to the integrated circuit board or the flexible printed circuit board by the above bonding method.

For example, the tolerance of the total expansion volume of the flexible substrate is as follows:

$$\sigma total=(\sigma A^2+\sigma B^2+\sigma C^2)^{1/2};$$

wherein σA is the tolerance of the expansion volume of the flexible substrate during the lift-off process; σB is the tolerance of the expansion volume of the flexible substrate during the back film attachment process; and σC is the tolerance of the expansion volume of the flexible substrate during the bonding process. After the expansion volume of the flexible substrate is compensated by the method of the embodiments of the present disclosure, σA and σB are combined into σ(A+B), so the tolerance of the total expansion volume of the flexible substrate becomes:

$$\sigma total^*(\sigma (A+B)^2+\sigma C^2)^{1/2};$$

It can be seen that σtotal* is smaller than σtotal.

Figure 8A:
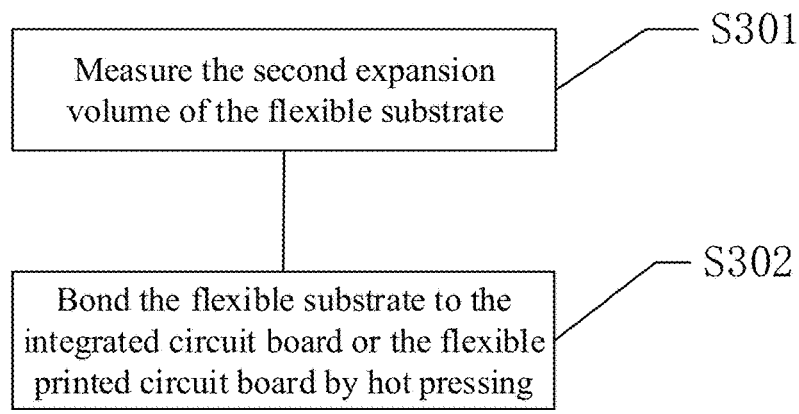
FIG. 8A to 8B are flowcharts of another bonding process of the flexible substrate provided by an embodiment of the present disclosure.

In the present embodiment, when the flexible substrate still has a certain expansion volume after the expansion volume is compensated, in the bonding process, in order to further reduce the position shift between the flexible substrate and the input/output pads of the integrated circuit board or the flexible printed circuit board caused by the expansion volume of the flexible substrate, in an example, referring to FIG. 8A, the process of bonding the flexible substrate to the integrated circuit board or the flexible printed circuit board may further include the following steps S301 to S302.

Step S301: measuring the second expansion volume of the flexible substrate.

In the present embodiment, the second expansion volume of the flexible substrate is the expansion volume generated by the flexible substrate after the lift-off process and the back film attachment process. The second expansion volume, for example, can be measured by an automatic optic inspection device, and the value of the second expansion volume can be obtained by measuring the dimensional change of the flexible substrate before and after the lift-off process and the back film attachment process. Certainly, other methods of measuring the expansion volume can also be used in the present embodiment, which is not limited in the present disclosure.

Step S302: bonding the flexible substrate to the integrated circuit board or the flexible printed circuit board by hot pressing.

In the present embodiment, the flexible substrate is bonded to the integrated circuit board or the flexible printed circuit board by an anisotropic conductive film (ACF) by hot pressing. In the hot-pressing bonding process, the temperature generally determines the softness of the anisotropic conductive film used in the bonding process, so that a suitable temperature can be selected according to the actual production requirements, and then the corresponding bonding pressure is selected according to the softness of the anisotropic conductive film. In the present embodiment, for example, according to a second corresponding relationship between the temperature applied to the flexible substrate and the thermal expansion volume generated by the flexible substrate being heated during the bonding process, and according to the value of the second expansion volume, a temperature at which the flexible substrate is bonded is selected to allow the thermal expansion volume of the flexible substrate during the bonding process, that is, a third expansion volume, to at least compensate for the second expansion volume.

In the present embodiment, the temperature and the second pressure are simultaneously applied to the flexible substrate. In the present embodiment, the second pressure is the pressure on the flexible substrate during the bonding process, and the pressure is usually 0.25-0.35 MPa; and in the present embodiment, for example, according to the temperature applied to the flexible substrate in the bonding process, the second pressure applied to the flexible substrate is selected to allow the temperature and the pressure applied to the flexible substrate to work together to generate the third expansion volume of the flexible substrate, and the third expansion volume can at least compensate for the second expansion volume that is, for example, generated after the lift-off process and the back film attachment process, so as to allow the total expansion volume of the flexible substrate to be further reduced and allow the differences in the expansion volume of different flexible substrates in production to be reduced.

Figure 8B:
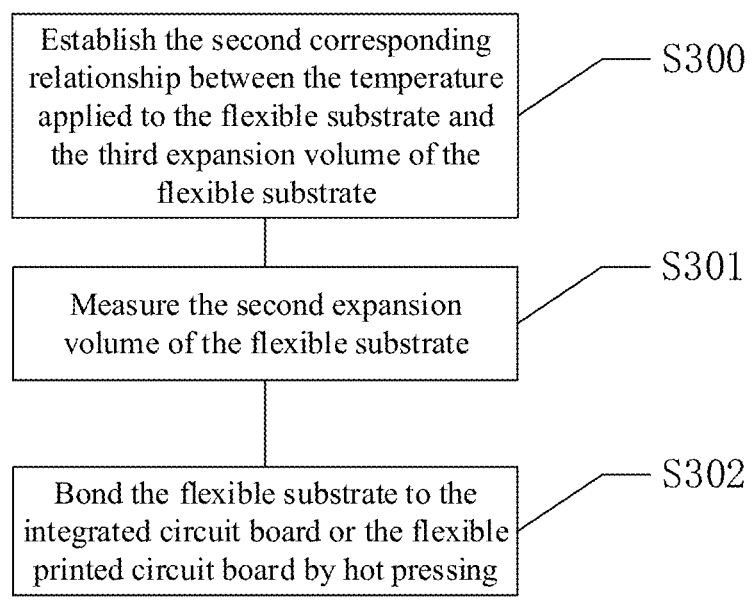

In the present example, as illustrated in FIG. 8B, the process of bonding the flexible substrate to the integrated circuit board or the flexible printed circuit board may further include:

Step S300: establishing the second corresponding relationship between the temperature applied to the flexible substrate and the third expansion volume of the flexible substrate.

Figure 9A:
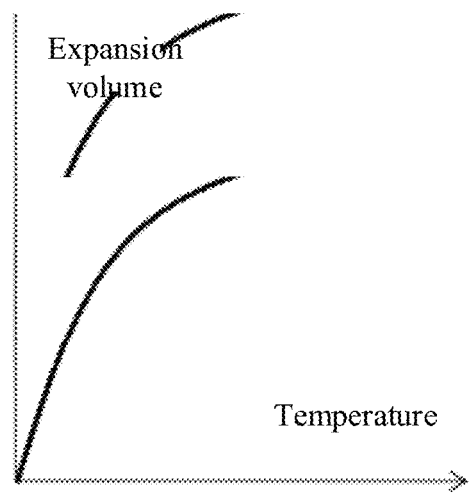
FIG. 9A to 9B are schematic diagrams of a relationship between a temperature applied to the flexible substrate and a thermal expansion volume generated by the flexible substrate during the bonding process of the flexible substrate provided in an embodiment of the present disclosure.
Figure 9B:
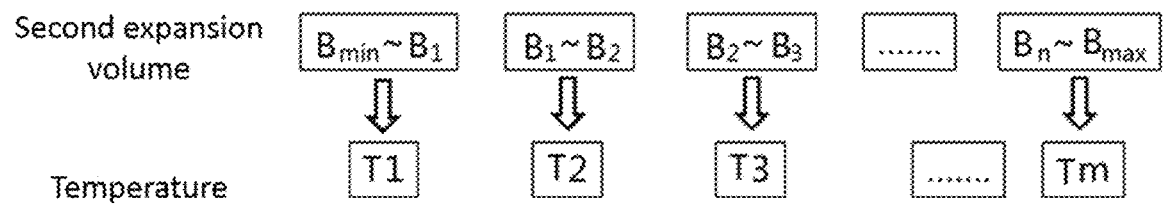

In the present example, the second corresponding relationship may be obtained before measuring the second expansion volume of the flexible substrate. The second corresponding relationship, for example, may be a change curve of the third expansion volume of the flexible substrate with respect to the temperature; and during obtaining the curve, the temperature applied to the flexible substrate should be gradually changed, the expansion volume of the flexible substrate under the temperature is simultaneously measured, and finally the temperature-pressure curve as illustrated in FIG. 9A is obtained; or, the second corresponding relationship, for example, may further be obtained by dividing the third expansion volume of the flexible substrate into a plurality of sections by size, and each of the sections corresponds to one temperature; and for example, as illustrated in FIG. 9B, the third expansion volume may be divided into a plurality of sections by size, such as $B_{min}$-$B_1$, $B_1$-$B_2$, $B_2$-$B_3$, ... $B_n$-$B_{max}$, and each section of the expansion volume respectively corresponds to one temperature value, that is, $T_1$, $T_2$, $T_3$, ... $T_m$; the temperature value corresponding to each section of the expansion volume, for example, may be a temperature value corresponding to one expansion volume within the section, or for example, may be the temperature value corresponding to the middle value of the expansion volume in the expansion volume section.

In addition, the size and the number of the sections of the third expansion volume can be adjusted according to the production situation. For example, when the production amount is large, a large section size of the second expansion volume is applied, that is, a small section number of the second expansion volume is applied, so that the process of selecting the temperature for the expansion volume of each flexible substrate can be simplified, and the production time can be reduced; and for another example, when the production amount is small, a small section size of the third expansion volume is applied, that is, a large section number of the third expansion volume is applied, and even the expansion volume-temperature curve in which the third expansion volume and the temperature have a one-to-one correspondence as illustrated in FIG. 9A is applied to select the temperature for the second expansion volume of each flexible substrate, thus allowing the selection of the temperature value to be more accurate, thereby achieving the technical effect of effectively controlling the expansion volume of the flexible substrate.

For example, the tolerance of the total expansion volume of the flexible substrate is as follows:

$$\sigma total = (\sigma A^2 + \sigma B^2 + \sigma C^2)^{1/2};$$

wherein σA is the tolerance of the expansion volume of the flexible substrate during the lift-off process; σB is the tolerance of the expansion volume of the flexible substrate during the back film attachment process; and σC is the tolerance of the expansion volume of the flexible substrate during the bonding process. After the expansion volume of the flexible substrate is compensated again by the method of the above examples, σA, σB and σC are combined into σ(A+B+C), so the tolerance of the total expansion volume of the flexible substrate becomes:

$$\sigma total^{**} = (\sigma(A+B+C)^2)^{1/2};$$

It can be seen that σtotal** is smaller than σtotal.

In summary, with the method of processing the flexible substrate provided by the embodiments of the present disclosure, the expansion volume of the flexible substrate during the production processes can be reduced, and the differences in the expansion volume of different flexible substrates in mass production can be reduced to allow the expansion volume of each flexible substrate to be controlled within a certain range, so that it is therefore more favorable to the subsequent preparation process of the flexible substrate, and for example, when the expansion volume of the flexible substrate is controlled to a small range, the bonding process of the flexible substrate can be performed by conventional methods in production, thereby expanding the application range of conventional methods for the bonding process.

At least one embodiment of the present disclosure provides a flexible substrate that is obtained by of any one of the above described processing method. The expansion volume of the flexible substrate is effectively controlled in production, and in one aspect, it is more convenient for the subsequent production process of the flexible substrate, for example, allowing the flexible substrate to be more easily or accurately bonded to the integrated circuit board or the flexible printed circuit board and allowing the bonding effect to be better; and in another aspect, the total expansion volume of the flexible substrate is small and can be controlled within a certain preset range, so that in mass production, the expansion volume of each flexible substrate is more uniform and the difference is smaller.

Figure 10A:
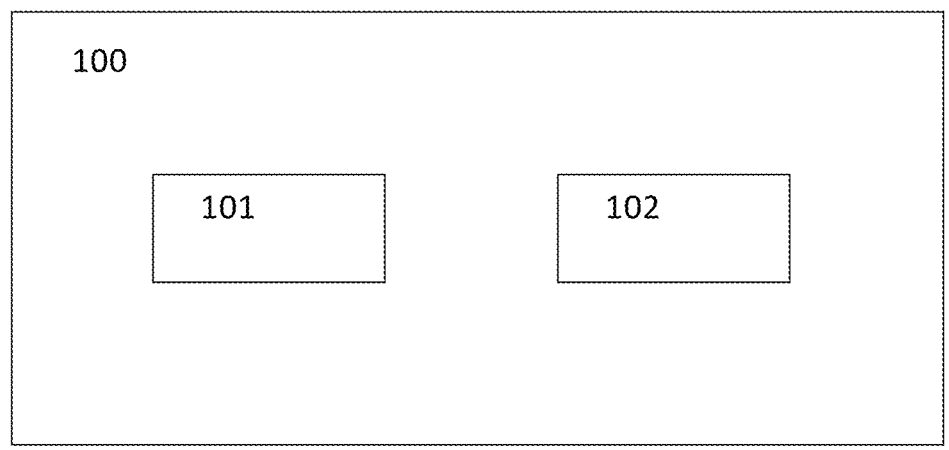
FIG. 10A to 10E are schematic diagrams of a system of processing the flexible substrate provided by an embodiment of the present disclosure.

At least one embodiment of the present disclosure provides a system of processing a flexible substrate, and as illustrated in FIG. 10A, the processing system 100 includes a measurer 101 and a controller 102. The measurer 101 is configured to measure a first expansion volume of the flexible substrate; and the controller 102 is configured to apply a first application pressure to the flexible substrate to laminate the flexible substrate on a base substrate. In the present embodiment, the measurer 101, for example, can be an automatic optic inspection device, and the automatic optic inspection device measures the dimensional change of the flexible substrate before and after the lift-off process to calculate the value of the expansion volume of the flexible substrate; and certainly, other expansion volume measurers can also be used in the present embodiment, which is not limited in the present disclosure. The controller 102, for example, can include a processor, and the processor can be a central processing unit (CPU), a microprocessor, a programmable logic controller, etc., and can execute computer codes, instructions or the like.

In the present embodiment, the controller 102 can be configured to, according to a first corresponding relationship between a first pressure applied to the flexible substrate and a compressive expansion volume generated by the flexible substrate in compression and according to the first expansion volume, select the first application pressure to allow the compressive expansion volume of the flexible substrate, that is, a second expansion volume, to at least partially compensate for the first expansion volume; the details of the first corresponding relationship between the first pressure and the compressive expansion volume generated by the flexible substrate in compression can refer to the above embodiments, and are not described again.

Figure 10B:
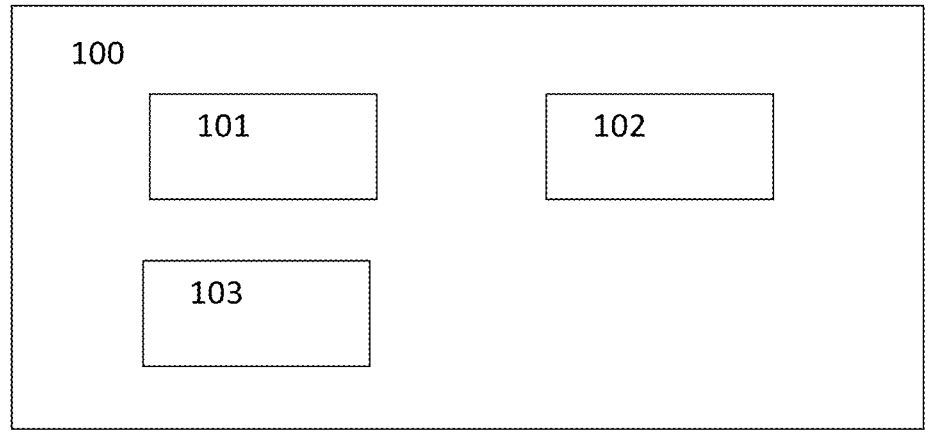

In another example of the present embodiment, as illustrated in FIG. 10B, the system of processing the flexible substrate may further include, for example, a stripper 103, which is configured to lift off the flexible substrate from a rigid substrate: the first expansion volume of the flexible substrate is a contraction volume generated when the flexible substrate is lifted off from the rigid substrate. For example, the stripper 103 may be a laser stripper, which may, include a base platform, a laser source, etc., and may also include an optical path control element such as a reflector.

Figure 10C:
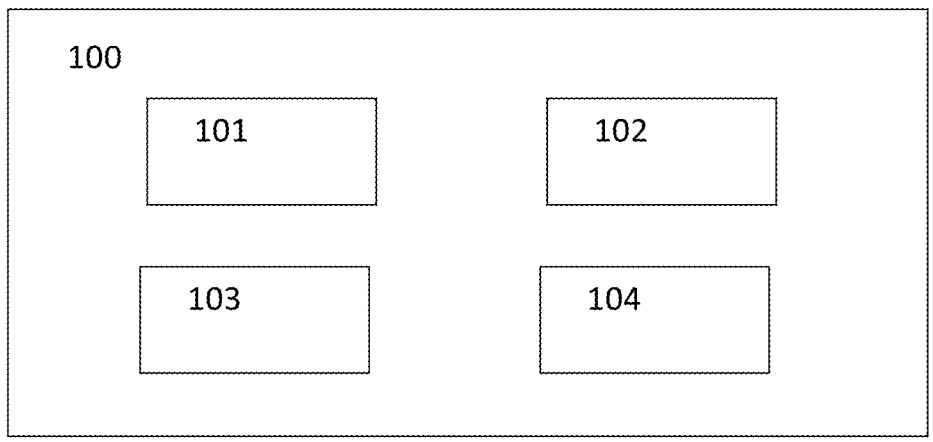

In another example of the present embodiment, as illustrated in FIG. 10C, the system of processing the flexible substrate may further include, for example, a back film attaching device 104, which is configured to attach a back film to the flexible substrate; the first pressure is a pressure applied to the flexible substrate during a back film attachment process; and the second expansion volume is an expansion volume generated by the flexible substrate during the back film attachment process, and the expansion volume is usually a relaxation volume. Therefore, the relaxation volume generated during the back film attachment process can compensate for the contraction volume generated when the flexible substrate is lifted off from the rigid substrate, thereby reducing the total expansion volume of the flexible substrate. For example the back film attaching device 104 is a roller pressing attaching device, which may include a base platform, a press roller, etc., and the attached back film, for example, is rolled around and stored on the roller, and is gradually released in operation.

Figure 10D:
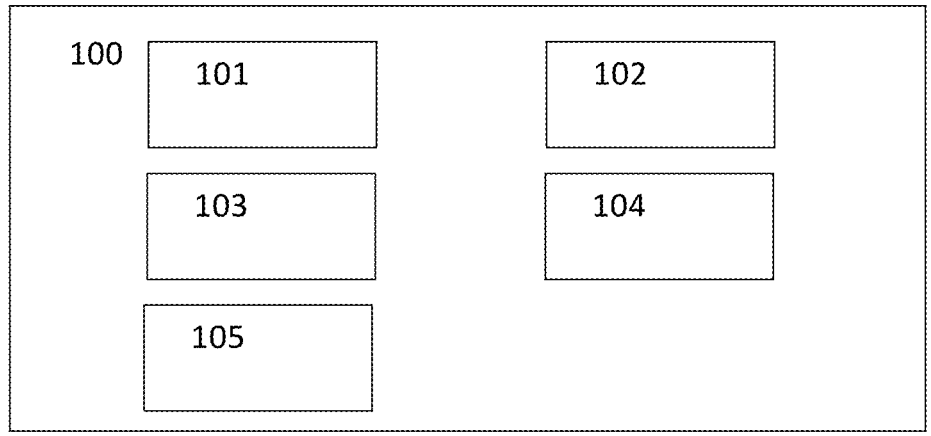

In another example of the present embodiment, as illustrated in FIG. 10D, the system of processing the flexible substrate may further include, for example, a memory 105, which is configured to store the first corresponding relationship between the first pressure applied to the flexible substrate and the second expansion volume generated by the flexible substrate. Therefore, according to the first corresponding relationship stored in the memory 105 and according to the first expansion volume, the controller 102 can select the first application pressure to effectively control the second expansion volume of the flexible substrate, thereby controlling the second expansion volume of the flexible substrate to compensate for the first expansion volume. The memory may include, for example, a magnetic storage medium, a semiconductor storage medium, etc., which is not limited in the embodiments of the present disclosure.

Figure 10E:
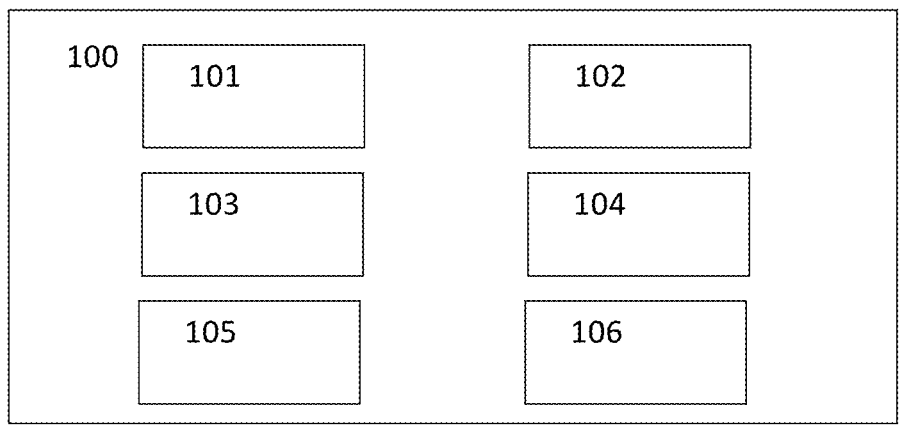

In another example of the present embodiment, as illustrated in FIG. 10E, the system of processing the flexible substrate may further include, for example, a bonder 106, which is configured to bond the flexible substrate to an integrated circuit board or a flexible printed circuit board. The specific bonding method is the same as the first embodiment, and details are not described again. The bonder 106 can be a hot-pressing bonder, which for example, includes a base platform, a point glue device a platen, a pressure head or the like.

In the present embodiment, during the bonding process of the flexible substrate, the measurer 101 is further configured to measure the second expansion volume of the flexible substrate; and meanwhile, the controller 102 is further configured to, according to a second corresponding relationship between a temperature applied to the flexible substrate and a thermal expansion volume generated by the flexible substrate which is heated during the bonding process and according to the second expansion volume, select a temperature at which the flexible substrate is bonded to allow a third expansion volume of the flexible substrate to at least compensate for the second expansion volume. In addition, the controller 102 is further configured to, according to the temperature applied to the flexible substrate during the bonding process, select a second pressure applied to the flexible substrate during the bonding process. Meanwhile, the memory 105 may also store a second corresponding relationship between the temperature applied to the flexible substrate and the third expansion volume of the flexible substrate. Therefore, according to the second corresponding relationship stored in the memory 105 and the third expansion volume, the controller 102 can select the suitable temperature to allow the third expansion volume of the flexible substrate to at least partially compensate for the second expansion volume, thereby controlling the expansion volume of the flexible substrate during the bonding process.

In summary, the system of processing the flexible substrate provided by at least one embodiment of the present disclosure can implement the method of processing the flexible substrate provided by the embodiments of the present disclosure, thereby achieving the technical effect of effectively controlling the expansion volume of the flexible substrate.

At least one embodiment of the present disclosure provides a flexible substrate, a method of processing a flexible substrate and a system of processing a flexible substrate having at least one of the following beneficial effects:

(1) A method of processing a flexible substrate provided by at least one embodiment of the present disclosure can effectively control the expansion volume of the flexible substrate during the production processes to reduce the expansion volume of the flexible substrate, and can reduce the differences in the expansion volume of different flexible substrates during the production processes in mass production to control the expansion volume of each flexible substrate within a certain preset range.

(2) A method of processing a flexible substrate provided by at least one embodiment of the present disclosure establish the corresponding relationship between the pressure and temperature applied to the flexible substrate and the expansion volume generated by the flexible substrate during the production processes, and adjust the expansion volume of the flexible substrate in a targeted manner according to the relationship to allow the expansion volume of the flexible substrate to be effectively controlled.

(3) A method of processing a flexible substrate provided by at least one embodiment of the present disclosure includes bonding the flexible substrate after compensating for the expansion volume of the flexible substrate to allow the bonding process to be easier, allowing the bonding process to be more accurate or allowing the bonding effect to be better.

(4) A system of processing a flexible substrate provided by at least one embodiment of the present disclosure can implement the method of processing the flexible substrate provided by the embodiments of the present disclosure to achieve the technical effect of controlling the expansion volume of the flexible substrate.

The followings are to be noted:

(1) The drawings of the present disclosure only relate to the structures relevant to the embodiments of the present disclosure, and other structures may be referred to the common design;

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In the case of no conflict, the embodiments of the present disclosure and the features of the embodiments may be combined with each other to obtain new embodiments.

What have been described above are only specific implementations of the present disclosure, the protection scope of the present disclosure is not limited thereto, the modification or replacement that are easily conceived by those skilled in the related art in the technical scope of the present disclosure should be in the protection scope of the present disclosure, and the protection scope of the present disclosure should be based on the protection scope of the claims.

What is claimed is:

1. A method of processing a flexible substrate, comprising:
   measuring a first expansion volume of the flexible substrate, wherein the first expansion volume is a contraction volume generated when the flexible substrate is lifted off from a rigid substrate; and
   applying a first application pressure to the flexible substrate to laminate the flexible substrate on a base substrate, and then removing the first application pressure;
   wherein according to a first corresponding relationship between a first pressure applied to the flexible substrate and a compressive expansion volume generated by the flexible substrate in compression and according to the first expansion volume, the first application pressure is selected to allow a second expansion volume of the flexible substrate to at least partially compensate for the first expansion volume, the second expansion volume is a relaxation volume;
   the method further comprises:
   establishing the first corresponding relationship between the first pressure applied to the flexible substrate and the compressive expansion volume of the flexible substrate;
   wherein establishing the first corresponding relationship between the first pressure applied to the flexible substrate and the compressive expansion volume of the flexible substrate comprises:

obtaining a change curve of the second expansion volume of the flexible substrate with respect to the first pressure; or dividing the second expansion volume of the flexible substrate into a plurality of sections by size, wherein each of the sections corresponds to one value of the first pressure.

2. The method of processing the flexible substrate according to claim 1, further comprising:

lifting off the flexible substrate from a rigid substrate, wherein the first expansion volume is a contraction volume generated when the flexible substrate is lifted off from the rigid substrate.

3. The method of processing the flexible substrate according to claim 2, wherein a laser lift-off process is conducted to lift off the flexible substrate from the rigid substrate.

4. The method of processing the flexible substrate according to claim 1, wherein the first application pressure is a pressure applied to the flexible substrate during a back film attachment process; and the second expansion volume is an expansion volume generated by the flexible substrate during the back film attachment process.

5. The method of processing the flexible substrate according to claim 1, further comprising:

subsequent to the lamination process, bonding the flexible substrate to an integrated circuit board or a flexible printed circuit board.

6. The method of processing the flexible substrate according to claim 5, wherein bonding the flexible substrate to the integrated circuit board or the flexible printed circuit board comprises:

measuring the second expansion volume of the flexible substrate; and according to a second corresponding relationship between a temperature applied to the flexible substrate and a thermal expansion volume generated by the flexible substrate being heated during the bonding process, and according to the second expansion volume, selecting a temperature at which the flexible substrate is bonded to allow a third expansion volume of the flexible substrate to at least compensate for the second expansion volume.

7. The method of processing the flexible substrate according to claim 6, further comprising:

according to the temperature applied to the flexible substrate during the bonding process, selecting a second pressure applied to the flexible substrate during the bonding process to allow the third expansion volume of the flexible substrate to at least compensate for the second expansion volume.

8. The method of processing the flexible substrate according to claim 6, further comprising:

establishing the second corresponding relationship between the temperature applied to the flexible substrate and the third expansion volume of the flexible substrate.

9. The method of processing the flexible substrate according to claim 5, wherein bonding the flexible substrate to the integrated circuit board or the flexible printed circuit board comprises:

tilting the flexible substrate and an input/output pad of the integrated circuit board or the flexible printed circuit board at a certain angle from a predetermined direction, and moving the input/output pad in the predetermined direction to allow the flexible substrate and the input/output pad of the integrated circuit board or the flexible printed circuit board to be aligned and bonded.

10. The method of processing the flexible substrate according to claim 6, wherein the first expansion volume and/or the second expansion volume is measured by an automatic optic inspection device.

11. A system of processing a flexible substrate, comprising:

a measurer, which is configured to measure a first expansion volume of the flexible substrate, wherein the first expansion volume is a contraction volume generated when the flexible substrate is lifted off from a rigid substrate; and a controller, which is configured to apply a first application pressure to the flexible substrate to laminate the flexible substrate on a base substrate, and then remove the first application pressure;

wherein according to a first corresponding relationship between a first pressure applied to the flexible substrate and a compressive expansion volume generated by the flexible substrate in compression and according to the first expansion volume, the first application pressure is selected to allow a second expansion volume of the flexible substrate to at least partially compensate for the first expansion volume, the second expansion volume is a relaxation volume;

further comprising:

a memory, which is configured to store the first corresponding relationship between the first pressure applied to the flexible substrate and the second expansion volume generated by the flexible substrate;

wherein the first corresponding relationship is established by:

obtaining a change curve of the second expansion volume of the flexible substrate with respect to the first pressure; or dividing the second expansion volume of the flexible substrate into a plurality of sections by size, wherein each of the sections corresponds to one value of the first pressure.

12. The system of processing the flexible substrate according to claim 11, further comprising:

a stripper, which is configured to lift off the flexible substrate from a rigid substrate, wherein the first expansion volume is a contraction volume generated when the flexible substrate is lifted off from the rigid substrate.

13. The system of processing the flexible substrate according to claim 11, further comprising:

a back film attaching device, which is configured to attach a back film to the flexible substrate;

wherein the first pressure is a pressure applied to the flexible substrate during a back film attachment process; and the second expansion volume is an expansion volume generated by the flexible substrate during the back film attachment process.

14. The system of processing the flexible substrate according to claim 11, further comprising:

a bonder, which is configured to bond the flexible substrate to an integrated circuit board or a flexible printed circuit board.

15. The system of processing the flexible substrate according to claim 14, wherein the measurer is further configured to measure the second expansion volume of the flexible substrate; and the controller is further configured to, according to a second corresponding relationship between a temperature applied to the flexible substrate and a thermal expansion volume generated by the flexible substrate being heated during the bonding process as well as the first expansion volume and the second expansion volume, select a temperature at which the flexible substrate is bonded to allow a third expansion volume of the flexible substrate to at least compensate for the second expansion volume.

16. The system of processing the flexible substrate according to claim 15, wherein the controller is further configured to, according to the temperature applied to the flexible substrate during the bonding process, select a second pressure applied to the flexible substrate during the bonding process.

* * * * *